United States Patent [19]
Yonezawa et al.

[11] Patent Number: 6,017,812
[45] Date of Patent: Jan. 25, 2000

[54] BUMP BONDING METHOD AND BUMP BONDING APPARATUS

[75] Inventors: Takahiro Yonezawa, Neyagawa; Osamu Nakao, Osaka; Shinji Kanayama, Kajiwara; Akihiro Yamamoto, Kobe; Makoto Imanishi, Neyagawa; Koichi Yoshida, Higashi-Osaka, all of Japan

[73] Assignee: Matsushita Electric Industrial Co., Ltd., Japan

[21] Appl. No.: 09/119,974

[22] Filed: Jul. 21, 1998

[30] Foreign Application Priority Data

Jul. 22, 1997 [JP] Japan .................................. 9-194676

[51] Int. Cl.[7] .................................................. H01L 21/44
[52] U.S. Cl. .............................. 438/613; 228/8; 228/25; 438/15; 438/14; 438/800
[58] Field of Search ............................... 438/613, 15, 14, 438/16, 800; 228/179.1, 8, 9, 12, 25, 32

[56] References Cited

U.S. PATENT DOCUMENTS

5,060,843  10/1991  Yasuzato et al. ................. 228/179
5,294,038  3/1994  Nakano .............................. 228/179.1
5,686,353  11/1997  Yagi et al. ........................... 438/15

*Primary Examiner*—Charles Bowers
*Assistant Examiner*—Craig Thompson
*Attorney, Agent, or Firm*—Parkhurst & Wendel, L.L.P.

[57] ABSTRACT

The present invention provides a bump bonding method that can prevent bumps from being inappropriately shaped. The bump bonding method comprises forming a gold ball (16) at the tip of a gold wire (1) that is inserted through a capillary (3), lowering the capillary (3) while using a displacement detection sensor to detect the vertical displacement of the capillary (3), detecting the position of that portion of an IC (11) in which an electrode is formed, based on the displacement of the capillary (3) detected by the displacement detection sensor when the gold ball (16) abuts the IC (11), pressing he gold ball (16) against the electrode forming portion to form a bump pedestal (17), elevating the capillary (3) a specified amount while moving it in the horizontal direction a specified amount, setting the height S of a position at which the capillary (3) is stopped based on the height H1 of the bump pedestal (17) detected by the displacement detection sensor, again lowering the capillary (3) down to the stop position height S to join the gold wire (1) to the bump pedestal (17), and then lifting the gold wire (1) to break the joint between the bump pedestal (17) and the gold wire (1).

3 Claims, 7 Drawing Sheets

BUMP BONDING METHOD AND BUMP BONDING APPARATUS

FIELD OF THE INVENTION

The present invention relates to a bump bonding method and apparatus that forms a protruding electrode on the IC side when constructing a flip-chip semiconductor integrated circuit (hereafter referred to as an "IC").

BACKGROUND OF THE INVENTION

A stud bump bonding method that applies a conventional IC-related wire bonding technique to supersonically join golden bumps to those portions of a flip-chip IC in which an electrode is formed is well known and described below.

Figure 4:
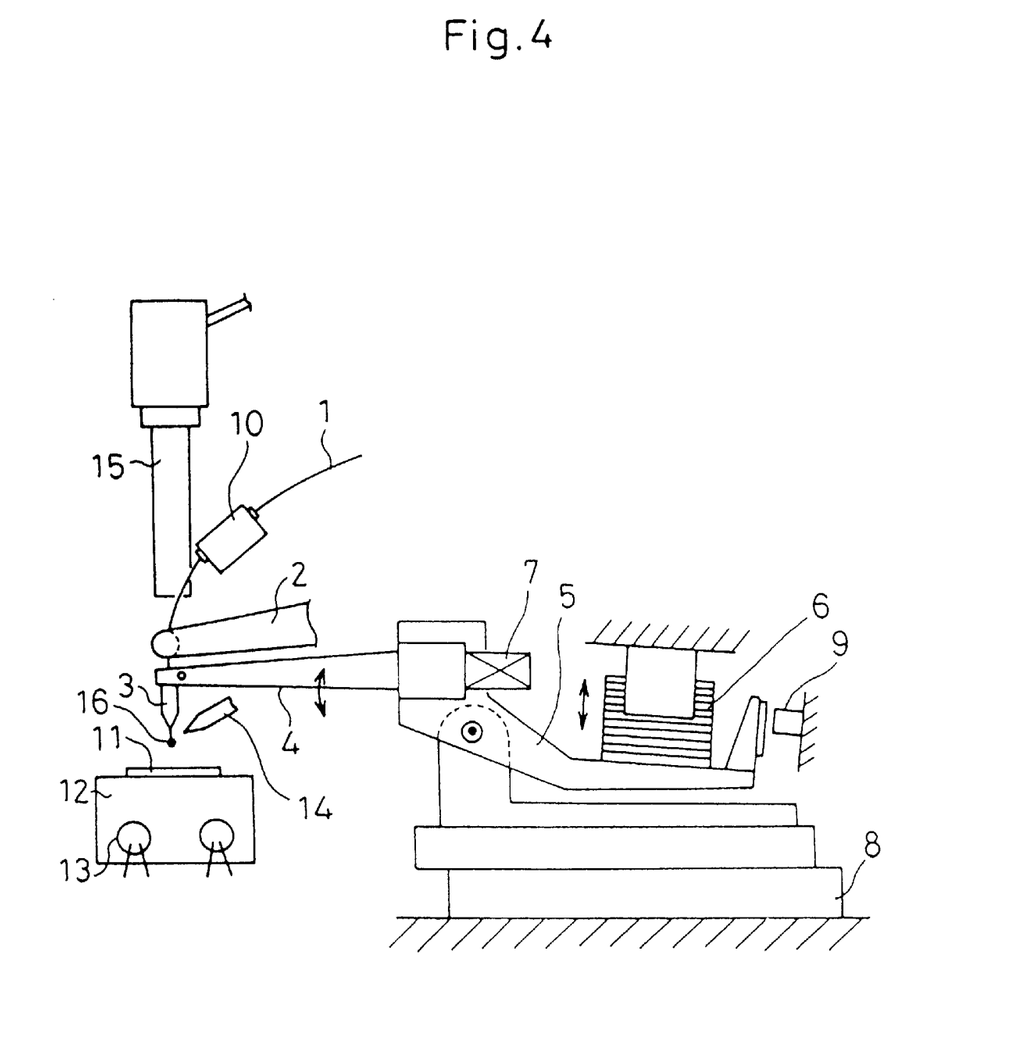
FIG. 4 shows a conventional bump bonding apparatus.

An example of a conventional bump bonding apparatus that is commonly used is shown in FIG. 4. A gold wire 1 is held by a damper 2 and penetrates a capillary 3. The capillary 3 is provided at the tip of a supersonic horn 4 provided on a supporting frame 5 that can rotationally move around the horizontal axis. When the supporting frame 5 is rotationally moved by a head vertical driving apparatus 6, the capillary 3 is moved in the vertical direction via the supersonic horn 4. The head vertical driving apparatus 6 comprises a coil motor. In addition, a supersonic oscillator 7 is provided on the supersonic horn 4.

The supporting frame 5 is provided on a horizontal moving table 8 that can move in the X and Y directions that cross each other in a horizontal plane. When the moving table 8 is moved, the capillary 3 moves in the horizontal direction. In addition, reference numeral 9 is a displacement detection sensor that detects the vertical displacement of the supporting frame 5, and the vertical position of the capillary 3 is determined based on the displacement of the supporting frame 5 detected by the displacement detection sensor 9.

An air tensioner 10 that lifts the gold wire 1 is provided above the clamper 2. In addition, a heat stage 12 that supports and heats an IC 11 is provided below the capillary 3. A heater 13 is provided in the heat stage 12. A spark generating apparatus 14 is provided near the tip of the gold wire 1 that is inserted through the capillary 3. A position-recognizing camera apparatus 15 for recognizing the position of the IC 11 is provided above the heat stage 12.

Figure 5A:
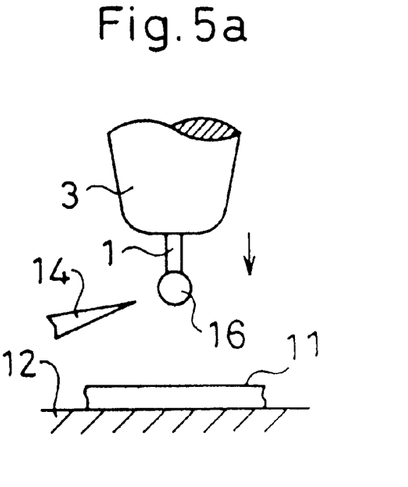
FIGS. 5a to 5f show the procedure of a conventional bump bonding method.

According to this configuration, the position-recognizing camera apparatus 15 recognizes the IC 11 on the heat stage 12 for positioning. Then, as shown in FIG. 5a, the spark generating apparatus 14 applies sparks to the tip of the gold wire 1 protruding downward from the capillary 3 in order to form a gold ball 16.

Figure 5B:
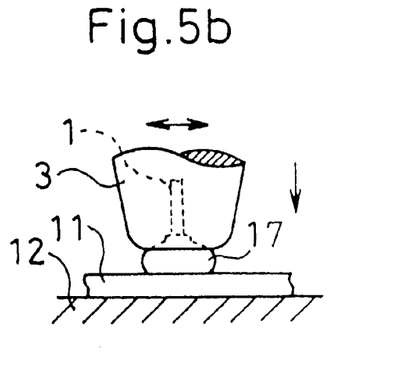

Subsequently, the head vertical driving apparatus 6 lowers the capillary 3, as shown in FIG. 5b. When the gold ball 16 abuts a portion of the IC 11 in which an electrode is formed from above, the vertical displacement of the supporting frame 5, which is detected by the displacement detection sensor 9, stops at a constant value to allow the height position of the electrode forming portion of the IC 11 to be detected. A predetermined amount of pressure is applied to the capillary 3 to press the gold ball 16 downward, and the supersonic oscillator 7 oscillates supersonic waves via the supersonic horn 4 to join the gold ball 16 to the electrode forming portion of the IC 11. This operation allows a bump pedestal 17 to be formed in the electrode forming portion of the IC 11.

Figure 5C:
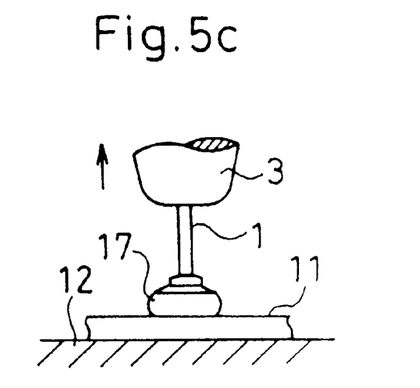

Then, as shown in FIG. 5c, the capillary 3 is elevated a specified amount by the head vertical driving apparatus 6 and then moved in the horizontal direction a specified amount by the movement of the moving table 8, followed by lowering.

Figure 5D:
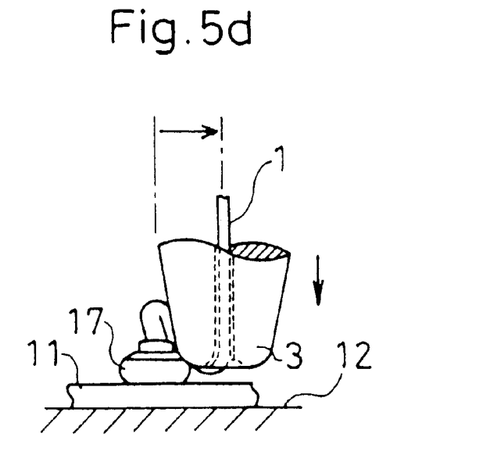

Then, as shown in FIG. 5d, the gold wire 1 abuts the bump pedestal 17 from above. The head vertical driving means is a VCM (voice coil motor) which allows the displacement detection sensor 9 to detect displacement while the value of driving current is measured. The current value increases at the time of abutment, but there occurs no more displacement. When the current exceeds a certain value (threshold value), it is so judged that the gold wire 1 has abutted the bump pedestal 17, and displacement at that time is stored. A predetermined amount of pressure is then applied to the capillary 3 to press the gold wire 1 downward to join it to the bump pedestal 17.

Figure 5E:
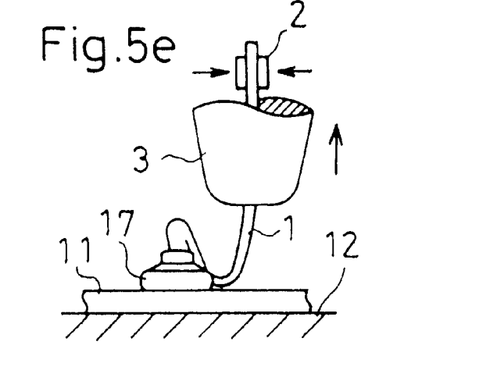
Figure 5F:
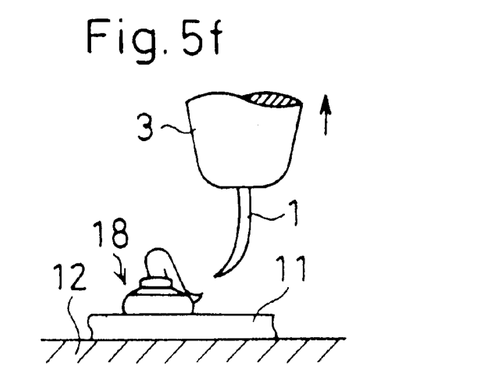

Then, as shown in FIG. 5e, the capillary 3 is again elevated a specified amount by the head vertical driving apparatus 6. The gold wire 1 is then raised by the air tensioner 10 while it is held by the damper 2, thereby causing the joint between the gold wire 1 and the bump pedestal 17 to be broken to form a protruding stud bump 18 in the electrode forming portion of the IC 11, as shown in FIG. 5f.

Such a conventional technique has the following problems.

Figure 6:
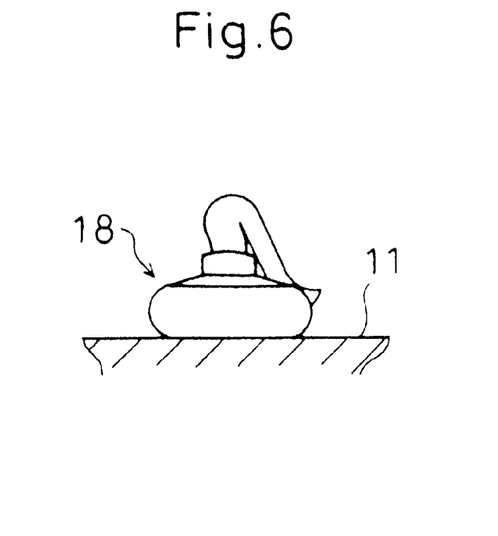
FIG. 6 shows a normally shaped bump.
Figure 7:
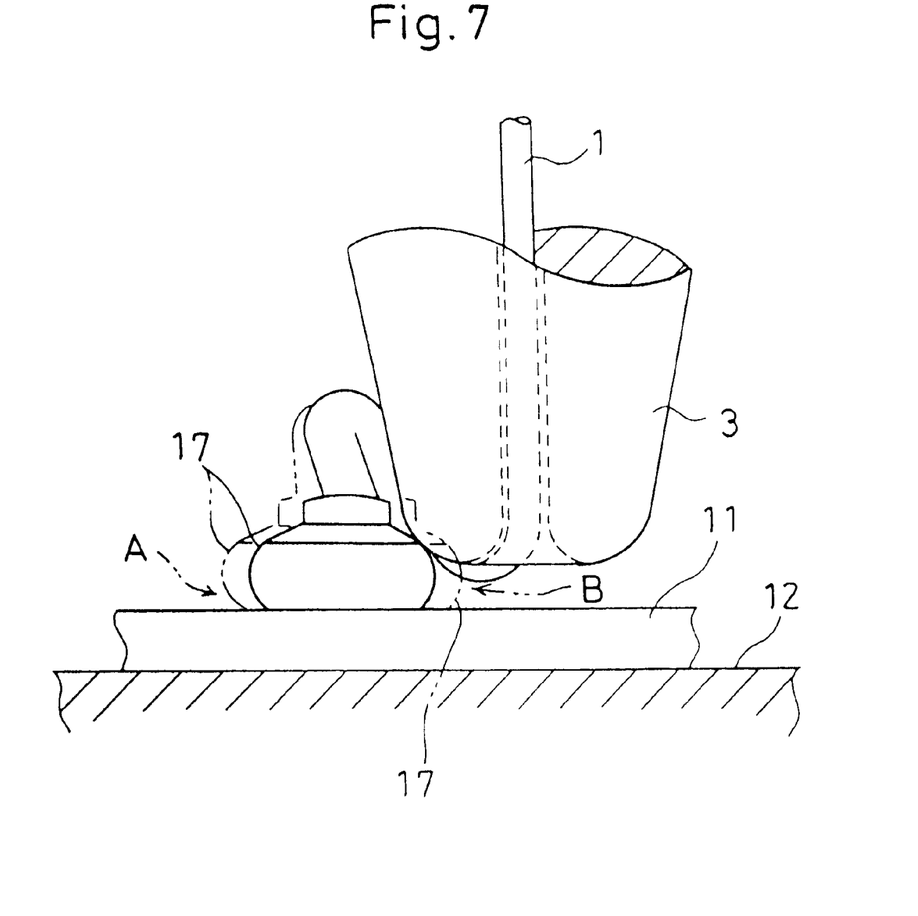
FIG. 7 is used to explain problems in the conventional bump bonding method.

FIG. 6 shows the stud bump 18 that is normally shaped. According to the conventional technique, however, in forming the stud bump 18, if, in the step shown in FIG. 5d, the position at which the bump pedestal 17 is formed is offset in a direction that leaves the capillary 3 in the horizontal direction (that is, to the left of the normal forming position as shown by imaginary line A in FIG. 7), the position at which the bump pedestal 17 and gold wire 1 are joined together becomes lower than the normal position. If the position at which the bump pedestal 17 is formed is offset in a direction that approaches the capillary 3 in the horizontal direction (that is, to the right of the normal forming position as shown by imaginary line B in FIG. 7), the position at which the bump pedestal 17 and gold wire 1 are joined together becomes higher than the normal position.

Figure 8:
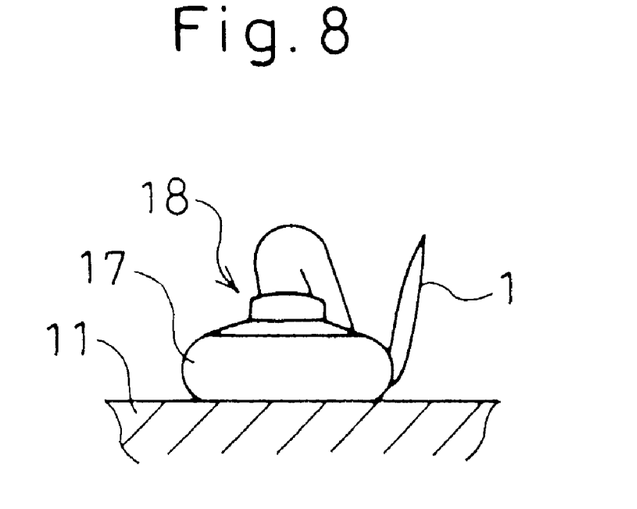
FIG. 8 shows an inappropriately shaped bump formed by the conventional bump bonding method.
Figure 9:
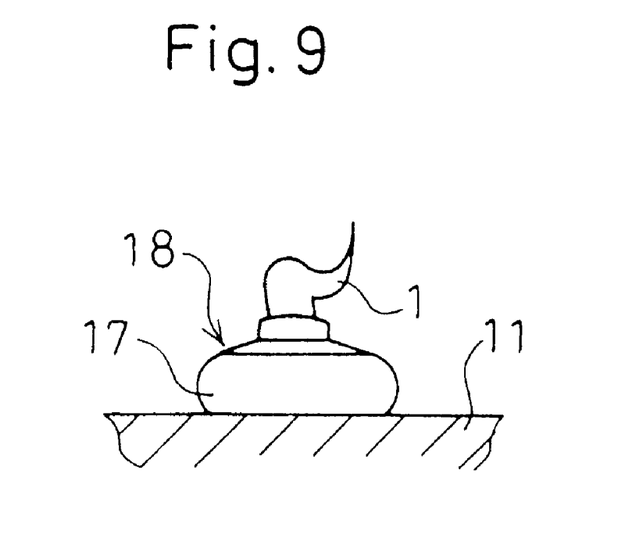
FIG. 9 shows an inappropriately shaped bump formed by the conventional bump bonding method.

Thus, if the forming position of the bump pedestal 17 is offset in the horizontal direction to vary the height of the joining position between the bump pedestal 17 and the gold wire 1, the stud bump 18 may be inappropriately shaped; for example, it may be destroyed while the gold wire 1 on the stud bump 18 side is standing in the vertical direction as shown in FIG. 8 or while the gold wire 1 on the stud bump 18 side is released from the bump pedestal 17. Such an inappropriate shape of the stud bump 18 causes the electrode to be connected inappropriately, thereby causing an inappropriate IC 11 to be produced.

In addition, the electrode forming position of the IC 11 and the position of the bump pedestal 17 are detected when the displacement detected by the displacement detection sensor 9 stops at a constant value. The search time required for detection, however, is relatively long and two detections (that is, the detection of the position of the electrode forming portion of the IC 11 in FIG. 5b and the detection of the position of the bump pedestal 17 in FIG. 5d) are required to form a single stud bump 18, resulting in a long production tact.

It is an object of this invention to provide a bump bonding method and apparatus that prevents bumps from being shaped inappropriately and that reduces the time required to form bumps.

DISCLOSURE OF THE INVENTION

To achieve this object, the bump bonding method according to this invention sets the height of the capillary stop position based on the height of the bump pedestal detected by the displacement detection apparatus and again lowers the capillary down to the stop position height to join the wire to the bump pedestal.

This invention prevents bumps from being shaped inappropriately and reduces the time required to form bumps.

The bump bonding method according to this invention comprises forming a ball at the tip of a wire that is inserted through a capillary, lowering the capillary while using a displacement detection apparatus to detect the vertical displacement of the capillary, detecting the position of that portion of a semiconductor integrated circuit in which an electrode is formed, based on the displacement of the capillary detected by the displacement detection apparatus when the ball abuts the semiconductor integrated circuit, pressing the ball against the electrode forming portion to form a bump pedestal, elevating the capillary a specified amount while moving it in the horizontal direction a specified amount, setting the height of a position at which the capillary is stopped based on the height of the bump pedestal detected by the displacement detection apparatus, again lowering the capillary down to the stop position height to join the wire to the bump pedestal, again elevating the capillary a specified amount, and then lifting the wire to break the joint between the bump pedestal and the wire to form a bump in the electrode forming portion of the semiconductor integrated circuit.

According to this method, the height of the capillary stop position is set based on the detected height of the bump pedestal, so the wire and the bump pedestal are joined together based on the height of the bump pedestal. This configuration precludes the height of the joint position between the bump pedestal and the wire from varying even when the forming position of the bump pedestal is offset in the horizontal direction, thereby preventing bumps from being inappropriately formed.

In addition, during the second lowering of the capillary, the conventional technique uses a displacement detection sensor to detect the position of the bump pedestal, whereas this invention does not require this detection. Accordingly, although the conventional technique requires two detections (that is, the detection of the position of the electrode forming portion of the semiconductor integrated circuit and the detection of the position of the bump pedestal) to form a single stud bump, this invention requires only a single detection (only the detection of the electrode forming position of the semiconductor integrated circuit), thereby reducing the time required to form bumps.

Another bump bonding method according to this invention comprises determining the variation of the surface height position of a semiconductor integrated circuit, forming a ball at the tip of a wire that is inserted through a capillary, lowering the capillary while using a displacement detection apparatus to detect the vertical displacement of the capillary, measuring beforehand the vertical distance between the ball and the position of that portion of a semiconductor integrated circuit in which an electrode is formed, based on the displacement of the capillary detected by the displacement detection apparatus when the ball abuts the semiconductor integrated circuit, lowering the capillary over the above vertical distance plus the variation of the surface height of the semiconductor integrated circuit, pressing the ball against the electrode forming portion to form a bump pedestal, while determining the height of the bump pedestal based on the displacement of the capillary detected by the displacement detection apparatus, elevating the capillary a specified amount while moving it in the horizontal direction a specified amount, setting the height of a position at which the capillary is stopped based on the height of the bump pedestal, again lowering the capillary down to the stop position height to join the wire to the bump pedestal, again elevating the capillary a specified amount, and then lifting the wire to break the joint between the bump pedestal and the wire to form a bump in the electrode forming portion of the semiconductor integrated circuit.

According to this method, the height of the capillary stop position is set based on the height of the bump pedestal, so the wire and the bump pedestal are joined together based on the height of the bump pedestal. This configuration precludes the height of the joint position between the bump pedestal and the wire from varying even when the forming position of the bump pedestal is offset in the horizontal direction, thereby preventing bumps from being inappropriately formed.

Furthermore, this method measures beforehand the vertical distance between the ball and the electrode forming portion of the semiconductor integrated circuit, so the capillary must be at first lowered only over a distance obtained by adding the variation of surface height plus the above vertical distance. Thus, the operation time is reduced by the amount of the search time required for detection compared to the method of determining that the stop position is reached when the amount of displacement detected by the displacement detection apparatus becomes constant.

A bump bonding apparatus according to this invention comprises a capillary through which a wire can be inserted; a ball forming means for forming a ball at the tip of the wire inserted through the capillary; an elevating apparatus for elevating and lowering the capillary; a moving apparatus for moving the capillary in the horizontal direction; a supporting member for supporting a semiconductor integrated circuit below the capillary; a joining means for joining the ball to that portion of the semiconductor integrated circuit in which an electrode is formed; a wire lifting apparatus for lifting the wire; a surface height position detecting apparatus for detecting the surface height position of the semiconductor integrated circuit supported on the supporting member; and a displacement detection apparatus for detecting the vertical displacement of the capillary.

According to this apparatus, the surface height position detection apparatus determines the variation of the surface height position of the semiconductor integrated circuit, the ball forming means forms a ball at the tip of the wire, and the elevating apparatus lowers the capillary. Then, the displacement detection apparatus detects the vertical displacement of the capillary, and based on the displacement of the capillary detected by the displacement detection apparatus when the ball abuts the semiconductor integrated circuit, the vertical distance between the ball and the electrode forming portion of the semiconductor integrated circuit is measured beforehand.

Subsequently, the elevating apparatus lowers the capillary over the above vertical distance plus the variation of the surface height of the semiconductor integrated circuit in order to press the ball against the electrode forming portion, and the joining means joins them together to form a bump pedestal. In this case, the height of the bump pedestal is determined based on the displacement of the capillary detected by the displacement detection apparatus, and the elevating apparatus elevates the capillary a specified amount while the moving apparatus moves it in the horizontal direction a specified amount. The height of the capillary stop position is set based on the height of the bump pedestal, and the elevating apparatus again lowers the capillary down to the stop position height to join the wire to the bump pedestal. After the elevating apparatus again lifts the capillary a specified amount, the wire lifting apparatus lifts the wire to break the joint between the bump pedestal and the wire, thereby forming a bump in the electrode forming position of the semiconductor integrated circuit.

As described above, the height of the capillary stop position is set based on the height of the bump pedestal, so the wire and the bump pedestal are joined together based on the height of the bump pedestal. This configuration precludes the height of the joint position between the bump pedestal and the wire from varying even when the forming position of the bump pedestal is offset in the horizontal direction, thereby preventing bumps from being inappropriately formed.

DESCRIPTION OF THE EMBODIMENTS

Embodiments of this invention are described with reference to FIGS. 1a to 3f.

(Embodiment 1)

A bump bonding apparatus according to Embodiment 1 has the same configuration as the above conventional apparatus, so the same reference numerals are used to describe a bump bonding method.

Figure 1A:
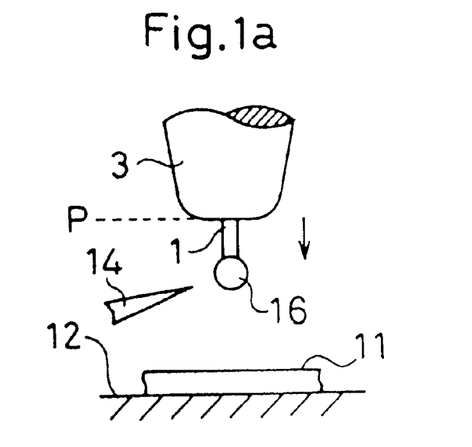
FIGS. 1a to 1f show the procedure of a bump bonding method according to Embodiment 1 of this invention.

That is, the position-recognizing camera apparatus 15 recognizes the IC 11 on the heat stage 12 for positioning. As shown in FIG. 1a, the spark generating apparatus 14 applies sparks to the tip of the gold wire 1 (an example of a wire) protruding downward from the capillary 3 in order to form a gold ball 16.

Figure 1B:
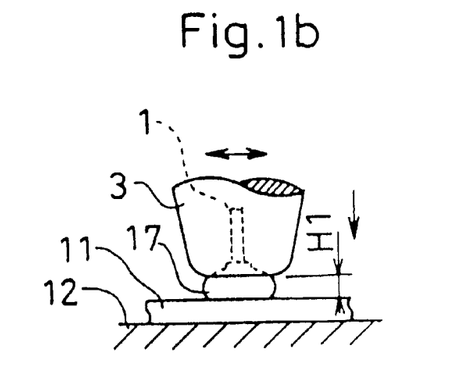

Subsequently, as shown in FIG. 1b, the head vertical driving apparatus 6 lowers the capillary 3 from a standby position P. When the gold ball 16 abuts the electrode forming portion of the IC 11 from above, the vertical displacement of the supporting frame 5 detected by the displacement detection sensor 9 stops at a constant value to allow the position of the electrode forming portion of the IC 11 to be detected. The determined height of the capillary 3 is read by the displacement detection sensor 9 and is stored in a control section as a pedestal height H1. In this case, the displacement is read by setting the position of origin of the displacement detection sensor 9 at the position where the capillary 3 having no gold ball 16 abuts the IC 11. Then, a predetermined amount of pressure is applied to the capillary 3 to press the gold ball 16 downward, and the supersonic oscillator 7 oscillates supersonic waves via the supersonic horn 14 to join the gold ball 16 to the electrode forming portion of the IC 11. This operation allows the bump pedestal 17 to be formed on the electrode forming portion of the IC 11.

Figure 1C:
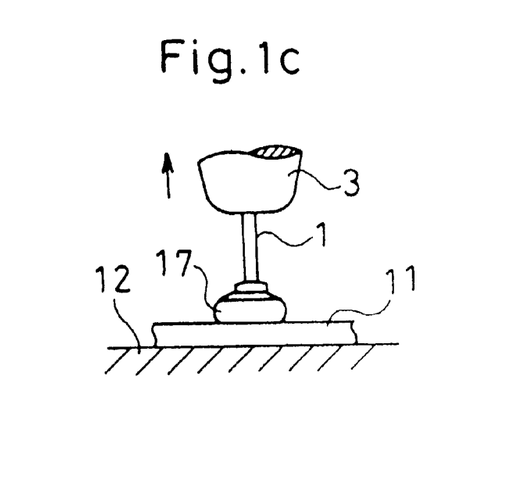

Then, as shown in FIG. 1c, the capillary 3 is elevated a specified amount by the head vertical driving apparatus 6 and then moved in the horizontal direction a specified amount by the movement of the moving table 8.

Figure 1D:
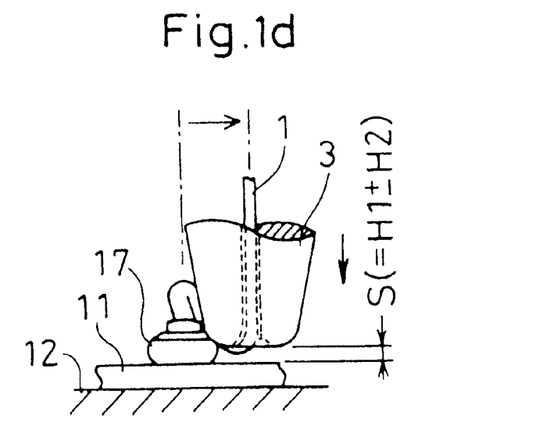

Subsequently, as shown in FIG. 1d, the capillary 3 is lowered down to a second stop position height S that is a relative position based on the pedestal height H1. The second stop position height S is defined as follows.

Second stop position height S=pedestal height H1±offset height H2

As specific numeral values, the pedestal height may be 20 $\mu$m and the offset height be 5 to 10 $\mu$m (when the gold wire is 25 $\mu$m). In this case, the offset height value is a value for correcting the height even when the actual capillary displacement and the displacement given by the displacement detection sensor 9 do not agree to each other because of elastic deflection of the supersonic horn or the like, and is a correction value in order for joining the gold wire to the pedestal but not to the IC. Subsequently, a predetermined amount of pressure is applied to the capillary 3 to press the gold wire 1 downward in order to join the gold wire 1 to the bump pedestal 17.

Figure 1E:
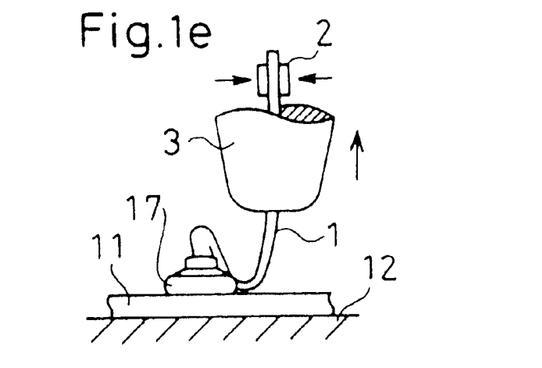
Figure 1F:
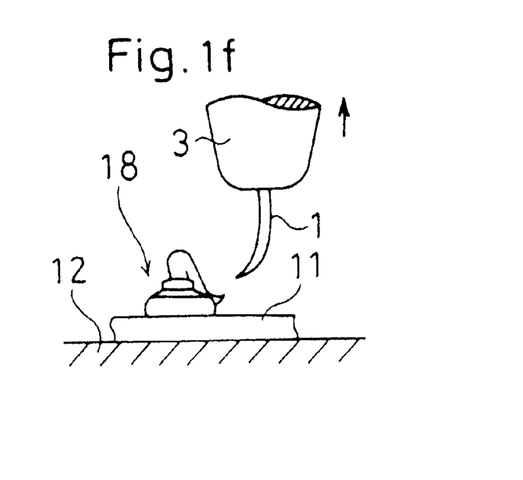

Then, as shown in FIG. 1e, the capillary 3 is again elevated a specified amount by the head vertical driving apparatus 6. The gold wire 1 is then raised by the air tensioner 10 while it is held by the clamper 2, thereby causing the joint between the gold wire 1 and the bump pedestal 17 to be broken to form a protruding stud bump 18 in the electrode forming portion of the IC 11, as shown in FIG. 1f.

As described above, the second stop position height S is set based on the pedestal height H1, so the gold wire 1 and the bump pedestal 17 are joined together based on the pedestal height H1. This configuration precludes the height of the joint position between the bump pedestal 17 and the gold wire 1 from varying even when the forming position of the bump pedestal 17 is offset in the horizontal direction, thereby preventing the bump 18 from being inappropriately formed.

In addition, during the second lowering of the capillary 3, the conventional technique uses the displacement detection sensor 9 to detect the position of the bump pedestal 17, whereas Embodiment 1 does not require this detection. Accordingly, although the conventional technique requires two detections (that is, the detection of the position of the electrode forming portion of the IC 11 in FIG. 5b and the detection of the position of the bump pedestal 17 in FIG. 5d) to form a single stud bump 18, Embodiment 1 requires only a single detection (only the detection of the position of the electrode forming portion of the IC 11 in FIG. 1b), thereby reducing the time required to form the bump 18.

(Embodiment 2)

Figure 2:
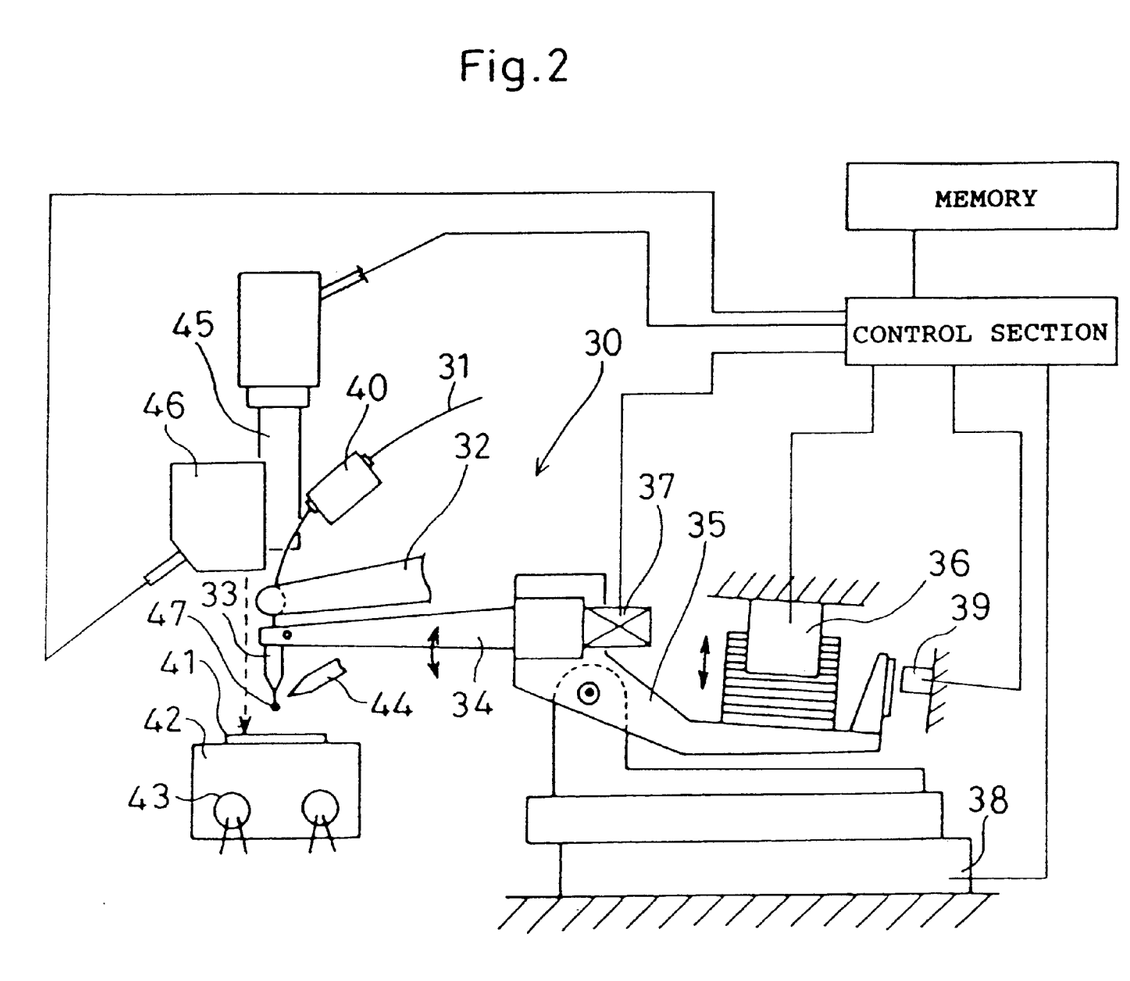
FIG. 2 shows a bump bonding apparatus according to Embodiment 2 of this invention.

As shown in FIG. 2, 30 is a bump bonding apparatus according to Embodiment 2, and a gold wire 31 (an example of a wire) is held by a clamper 32 and inserted through a capillary 33. The capillary 33 is provided at the tip of a supersonic horn 34 provided on a supporting frame 35 that can rotationally move around the horizontal axis. When the supporting frame 35 is rotationally moved by a head vertical driving apparatus 36 (an example of an elevating apparatus), the capillary 33 is moved in the vertical direction via the supersonic horn 34. The head vertical driving apparatus 36 comprises a coil motor. In addition, a supersonic oscillator 37 is provided on the supersonic horn 34. The supersonic horn 34 and the supersonic oscillator 37 are an example of joining means for joining a gold ball 47 and an electrode forming portion of an IC 41.

The supporting frame 35 is provided on a horizontal moving table 38 (an example of a moving apparatus) that can move in the X and Y directions that cross each other in a horizontal plane. When the moving table 38 is moved, the capillary 33 moves in the horizontal direction. Reference numeral 39 is a displacement detection sensor that detects the vertical displacement of the supporting frame 35, and the vertical position of the capillary 33 is determined based on the displacement of the supporting frame 35 detected by the displacement detection sensor 39.

An air tensioner 40 (an example of a wire lifting apparatus) that lifts the gold wire 31 is provided above the clamper 32. In addition, a heat stage 42 (an example of a supporting member) that supports and heats the IC 41 is provided below the capillary 33. A heater 43 is provided in the heat stage 42. A spark generating apparatus 44 (an example of a ball forming means) is provided near the tip of the gold wire 31 that is inserted through the capillary 33. In addition, a position-recognizing camera apparatus 45 for recognizing the position of the IC 41 and a displacement gauge 46 (a surface height position detection apparatus) that measures the surface height position of the IC 41 are provided above the heat stage 42.

A bump bonding method using the bump bonding apparatus 30 is described below.

Figure 3A:
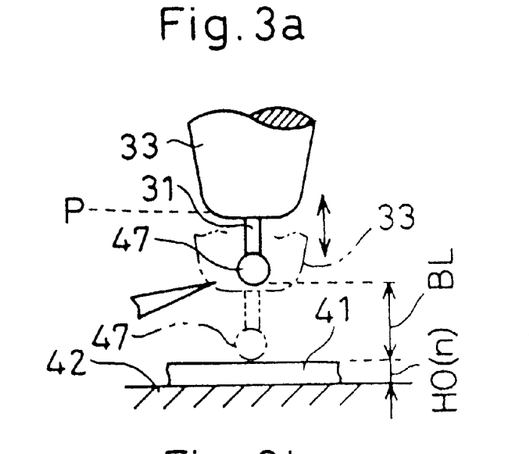
FIGS. 3a to 3f show the procedure of a bump bonding method using a bump bonding apparatus according to Embodiment 2.

First, the position-recognizing camera apparatus 45 recognizes the IC 41 on the heat stage 42 for positioning. Furthermore, as shown in FIG. 3a, the displacement gauge 46 is used to measure the surface height of the IC 41 on the heat stage 42, and the measured surface height is stored in a control section as H0(n). In this case, the surface height H0(n) of the IC 41 slightly varies among a plurality of ICs 41, so the control section compares H0(n) with the stored surface height H0(n−1) of the preceding IC 41 on which a bump has been formed in order to determine the difference between them ΔH0. Then, the spark generating apparatus 44 applies sparks to the tip of the gold wire 31 protruding downward from the capillary 33 in order to form a gold ball 47.

Subsequently, as shown by the imaginary line in FIG. 3a, the head vertical driving apparatus 36 lowers the capillary 33 from a standby position P. Based on the displacement of the capillary 33 detected by the displacement detection sensor 39 when the gold ball 47 abuts the electrode forming portion of the IC 41, the vertical distance BL (bonding level) between the gold ball 47 and the electrode forming portion of the IC 41 is determined beforehand while the capillary 33 is standing by at the standby position P.

Figure 3B:
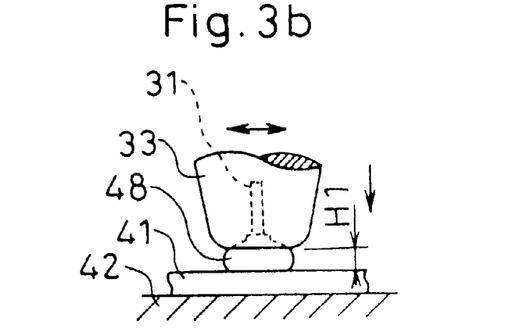

As shown in FIG. 3b, the head vertical driving apparatus 36 lowers the capillary 33 over the vertical distance BL+ΔH0. Then, the gold ball 47 abuts the electrode forming portion of the IC 41 from above to apply a predetermined amount of pressure to the capillary 33 to press the gold ball 47 downward. Furthermore, the supersonic oscillator 37 oscillates supersonic waves via the supersonic horn 34 to join the gold ball 47 to the electrode forming portion of the IC 41. This operation allows a bump pedestal 48 to be formed in the electrode forming portion of the IC 41. In this case, the position of the capillary 33 that has lowered over the vertical distance BL+ΔH0 is detected by the displacement detection sensor 39 and based on this position, the height H1 of the bump pedestal 48 is determined.

Figure 3C:
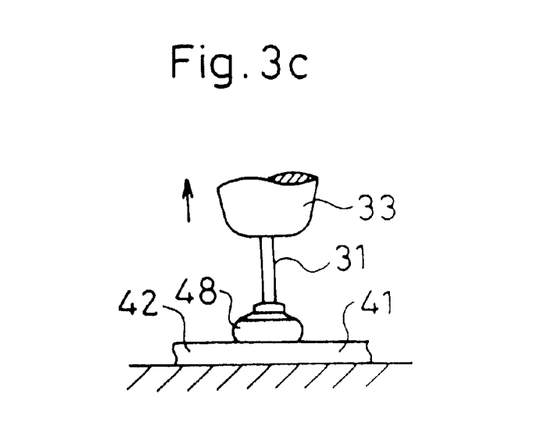

Then, as shown in FIG. 3c, the capillary 33 is elevated a specified amount by the head vertical driving apparatus 36 and then moved in the horizontal direction a specified amount by the movement of the moving table 38.

Figure 3D:
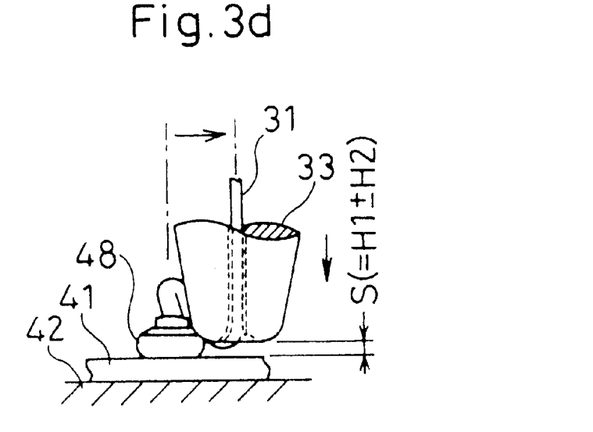

Subsequently, as shown in FIG. 3d, the capillary 33 is lowered down to a second stop position height S that is a relative position based on the pedestal height H1. The second stop position height S is defined as follows.

Second stop position height S=pedestal height H1±offset height H2

As specific numeral values, the pedestal height may be 20 μm and the offset height be 5 to 10 μm (when the gold wire is 25 μm). In this case, the offset height value is a value for correcting the height even when the actual capillary displacement and the displacement given by the displacement detection sensor 9 do not agree to each other because of elastic deflection of the supersonic horn or the like, and is a correction value in order for joining the gold wire to the pedestal but not to the IC. Subsequently, a predetermined amount of pressure is applied to the capillary 33 to press the gold wire 31 downward in order to join the gold wire 31 to the bump pedestal 48.

Figure 3E:
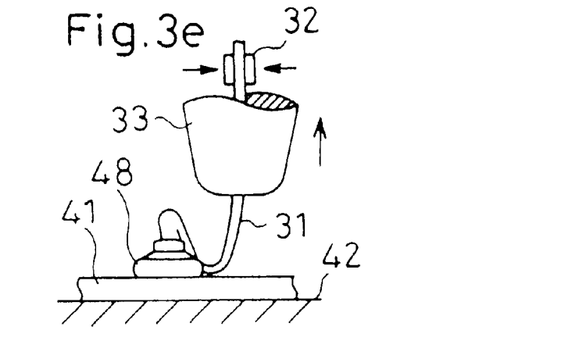
Figure 3F:
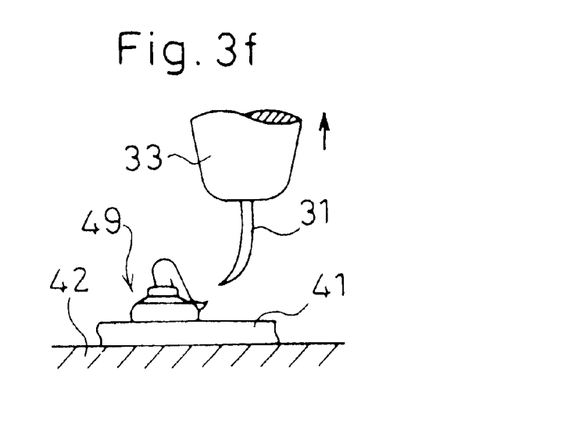

Then, as shown in FIG. 3e, the capillary 33 is again elevated a specified amount by the head vertical driving apparatus 36. The gold wire 31 is then raised by the air tensioner 10 while it is held by the damper 32, thereby causing the joint between the gold wire 31 and the bump pedestal 48 to be broken to form a protruding stud bump 49 in the electrode forming portion of the IC 41, as shown in FIG. 3f.

As described above, the second stop position height S is set based on the pedestal height H1, so the gold wire 31 and the bump pedestal 48 are joined together based on the pedestal height H1. This configuration precludes the height of the joint position between the bump pedestal 48 and the gold wire 31 from varying even when the forming position of the bump pedestal 48 is offset in the horizontal direction, thereby preventing the bump 49 from being inappropriately formed.

In addition, during the second lowering of the capillary 33, the conventional technique uses the displacement detection sensor 39 to detect the position of the bump pedestal 48, whereas Embodiment 2 does not require this detection. Accordingly, although the conventional technique requires two detections (that is, the detection of the position of the electrode forming portion of the IC 11 in FIG. 5b and the detection of the position of the bump pedestal 17 in FIG. 5d) to form a single stud bump 49, Embodiment 2 uses a first IC 41 to detect the vertical distance BL shown in FIG. 3a and adapts it to a second and subsequent ICs 41, so if the bump 49 is formed in the second or subsequent ICs 41, this embodiment requires only a single detection (only the detection of the pedestal height H1 of the bump pedestal 48 in FIG. 3b), thereby reducing the time required to form the bump 18.

As described above, this invention prevents bumps from being inappropriately shaped and reduces the time required to form bumps. Particularly, in Embodiment 2, actual height of the gold wire can be detected as the effect of measurement of the surface height position of the IC by the displacement gauge, whereby the displacement detection sensor can be free of such problem as is caused by deflection of the horn. As a result, further improvement can be made to the accuracy of the displacement and to the control of the gold wire height.

We claim:

1. A bump bonding method comprising forming a ball at the tip of a wire that is inserted through a capillary, lowering said capillary while using a displacement detection apparatus to detect the vertical displacement of the capillary, detecting the position of that portion of a semiconductor integrated circuit in which an electrode is formed, based on the displacement of the capillary detected by the displacement detection apparatus when said ball abuts the semiconductor integrated circuit, pressing said ball against said electrode forming portion to form a bump pedestal, elevating said capillary a specified amount while moving it in the horizontal direction a specified amount, setting the height of a position at which the capillary is stopped based on the height of the bump pedestal detected by said displacement detection apparatus, again lowering the capillary down to said stop position height to join said wire to the bump pedestal, again elevating said capillary a specified amount, and then lifting said wire to break the joint between said bump pedestal and the wire to form a bump in the electrode forming portion of the semiconductor integrated circuit.

2. A bump bonding method comprising determining the variation of the surface height position of a semiconductor integrated circuit, forming a ball at the tip of a wire that is inserted through a capillary, lowering said capillary while using a displacement detection apparatus to detect the vertical displacement of the capillary, measuring beforehand the vertical distance between said ball and the position of that portion of a semiconductor integrated circuit in which an electrode is formed, based on the displacement of the capillary detected by the displacement detection apparatus when said ball abuts the semiconductor integrated circuit, then lowering said capillary over the above vertical distance plus the variation of the surface height of said semiconductor integrated circuit, pressing said ball against said electrode forming portion to form a bump pedestal, while determining the height of said bump pedestal based on the displacement of the capillary detected by said displacement detection apparatus, elevating said capillary a specified amount while moving it in the horizontal direction a specified amount, setting the height of a position at which the capillary is stopped based on the height of said bump pedestal, again lowering the capillary down to said stop position height to join said wire to the bump pedestal, again elevating said capillary a specified amount, and then lifting said wire to break the joint between said bump pedestal and the wire to form a bump in the electrode forming portion of the semiconductor integrated circuit.

3. A bump bonding apparatus comprising a capillary through which a wire can be inserted; a ball forming means for forming a ball at the tip of the wire inserted through the capillary; an elevating apparatus for elevating and lowering said capillary; a moving apparatus for moving said capillary in the horizontal direction; a supporting member for supporting a semiconductor integrated circuit below the capillary; a joining means for joining said ball to that portion of the semiconductor integrated circuit in which an electrode is formed; a wire lifting apparatus for lifting said wire; a surface height position detection apparatus for detecting the surface height position of the semiconductor integrated circuit supported on the supporting member; and a displacement detection apparatus for detecting the vertical displacement of said capillary.

* * * * *